(12) United States Patent
Jung et al.

(10) Patent No.: US 7,760,562 B2
(45) Date of Patent: Jul. 20, 2010

(54) ADDRESS MULTIPLEXING IN PSEUDO-DUAL PORT MEMORY

(75) Inventors: Chang Ho Jung, San Diego, CA (US); Cheng Zhong, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 90 days.

(21) Appl. No.: 12/047,593

(22) Filed: Mar. 13, 2008

(65) Prior Publication Data

US 2009/0231937 A1  Sep. 17, 2009

(51) Int. Cl.
*G11C 7/00* (2006.01)
(52) U.S. Cl. ............. 365/194; 365/230.02; 365/230.05; 365/230.08
(58) Field of Classification Search ............ 365/230.02, 365/194, 230.05, 230.08, 230.12
See application file for complete search history.

(56) References Cited

U.S. PATENT DOCUMENTS

| | | | |
|---|---|---|---|
| 6,519,187 B2 * | 2/2003 | Wada | 365/189.05 |
| 6,882,562 B2 * | 4/2005 | Beucler | 365/154 |
| 7,251,193 B2 * | 7/2007 | Jung | 365/233.5 |
| 7,499,347 B2 | 3/2009 | Chen et al. | |

FOREIGN PATENT DOCUMENTS

WO  2007114858  10/2007

OTHER PUBLICATIONS

International Search Report-PCT/US09/035371, International Search Authority-European Patent Office-Jun. 24, 2009.
Written Opinion-PCT/US09/035371, International Search Authority-European Patent Office-Jun. 24, 2009.

* cited by examiner

*Primary Examiner*—Tuan T Nguyen
*Assistant Examiner*—Toan Le
(74) *Attorney, Agent, or Firm*—Sam Talpalatsky; Nicholas J. Pauley; Peter M. Kamarchik

(57) ABSTRACT

A pseudo-dual port memory address multiplexing system includes a control circuit operative to identify a read request and a write request to be accomplished during a single clock cycle. A self time tracking circuit monitors a read operation and generates a switching signal when the read operation is determined to be complete. A multiplexer is responsive to the switching signal for selectively providing a read address and a write address to a memory address unit at the proper time.

20 Claims, 3 Drawing Sheets

ADDRESS MULTIPLEXING IN PSEUDO-DUAL PORT MEMORY

FIELD OF DISCLOSURE

The disclosure relate generally to memory circuits. More specifically, the disclosure relates to address control for pseudo-dual port memories.

BACKGROUND

Dual port memories typically have two ports and an array of memory cells. The memory array can be simultaneously accessed from both of the ports provided that the memory cells being accessed from one port are not the same memory cells that are being accessed from the other port. A common type of memory cell used in such dual port memories involves eight field effect transistors (FETs).

The memory cells in a single port memory typically only include six transistors. The six-transistor memory cell typically consumes only about half as much integrated circuit area as the eight-transistor cell when the two types of memory cells are fabricated using the same process. However, many application require the functionality of a dual port memory, i.e., a memory capable of handling both a read and a write operation within a single clock cycle.

In order to take advantage of the smaller size of the six-transistor memory cell, while still satisfying those applications requiring dual port memory functionality, a memory device called a pseudo-dual port memory is often used. In one example, a pseudo-dual port memory has a single memory array wherein each memory cell of the array is a six-transistor memory cell that can be selectively coupled to a single pair of bit lines (for example, bit line B and bit line bar BN).

The memory array operates as a single port memory in that only one memory access is performed at one time. The pseudo-dual port memory, however, mimics a dual port memory in that it has two ports. In one example, the pseudo-dual port memory has circuitry sometimes called a Time Delayed Multiplexer (TDM). A single input clock signal is received at the pseudo-dual port memory and this single input clock signal is used to latch an input read address, an input write address, and an input data value. The rising edge of the input clock signal is used to initiate a read operation using the input read address. The read operation is completed. Thereafter, the falling edge of the input clock signal occurs. The TDM uses the falling edge of the input clock signal to initiate a write operation. The input write address is used to address the memory array during the write operation and the data written into the memory array is the input data value. Although two memory operations are performed in a single cycle of the input clock signal, the two memory operations are in reality performed one after the other. From outside the pseudo-dual port memory, however, the pseudo-dual port memory appears to allow two accesses of the memory array at the same time or substantially at the same time, i.e., within a single clock cycle.

The amount of time required to perform the first read memory operation may not be equal to the amount of time required to perform the second write memory operation. Using a conventional TDM approach slows overall memory access times because the relative amounts of time available for the two operations is determined by the time when the rising edge of the clock cycle occurs and the time when the falling edge of the clock cycle occurs. If, for example, the clock signal is low for as long as it is high in a clock cycle (i.e., the clock signal has a 50/50 duty cycle), then the same amount of time must be allowed for performing both the faster read operation and the slower write operation. The result is an amount of wasted time that starts after the read operation has been completed and ends upon the falling edge of the clock signal.

SUMMARY OF THE DISCLOSURE

According to an embodiment of the present disclosure, a pseudo dual port memory address multiplexing system has a read port address latch, a write port address latch, a control circuit, and a multiplexer. The read port address latch is operable to hold a read address in response to an external clock signal. The write port address latch is operable to hold a write address in response to the external clock signal. The control circuit controls read/write memory access based upon monitoring of a first memory operation. The multiplexer switches between a held read address and a held write address in response to a switch signal from the control circuit.

In another embodiment of the present invention, a method controls an application of an address signal to a memory. The method includes detecting read and write requests. In response to a read request in the absence of a write request, the method includes supplying a read address to a memory component. In response to a write request in the absence of a read request, the method includes supplying a write address to the memory component.

In response to both a read request and a write request to be performed during a single clock cycle, the method includes supplying the read address to the memory component. Based upon monitoring of a read operation, the method further includes determining a time within the single clock cycle to supply the write address to the memory component. The method also includes switching between the read address and the write address to supply the write address to the memory component at the determined time.

An advantage of the disclosed embodiments is that address multiplexing is provided in pseudo-dual port memory without impacting a read access time. In addition, the multiplexing is performed with minimum area and performance penalties The foregoing has outlined, rather broadly, features and technical advantages in order that the detailed description that follows may be better understood. Additional features and advantages will be described hereinafter which form the subject of the claims. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features, which are believed to be characteristic of the invention, both as to its organization and method of operation, together with further objects and advantages, will be better understood from the following description when considered in connection with the accompanying figures. It is to be expressly understood, however, that each of the figures is provided for the purpose of illustration and description only, and is not intended as a definition of the limits of the present invention.

BRIEF DESCRIPTION OF THE DRAWINGS

For a more complete understanding of the present disclosure, reference is now made to the following description taken in conjunction with the accompanying drawings.

DESCRIPTION OF EMBODIMENTS OF THE INVENTION

Figure 1:
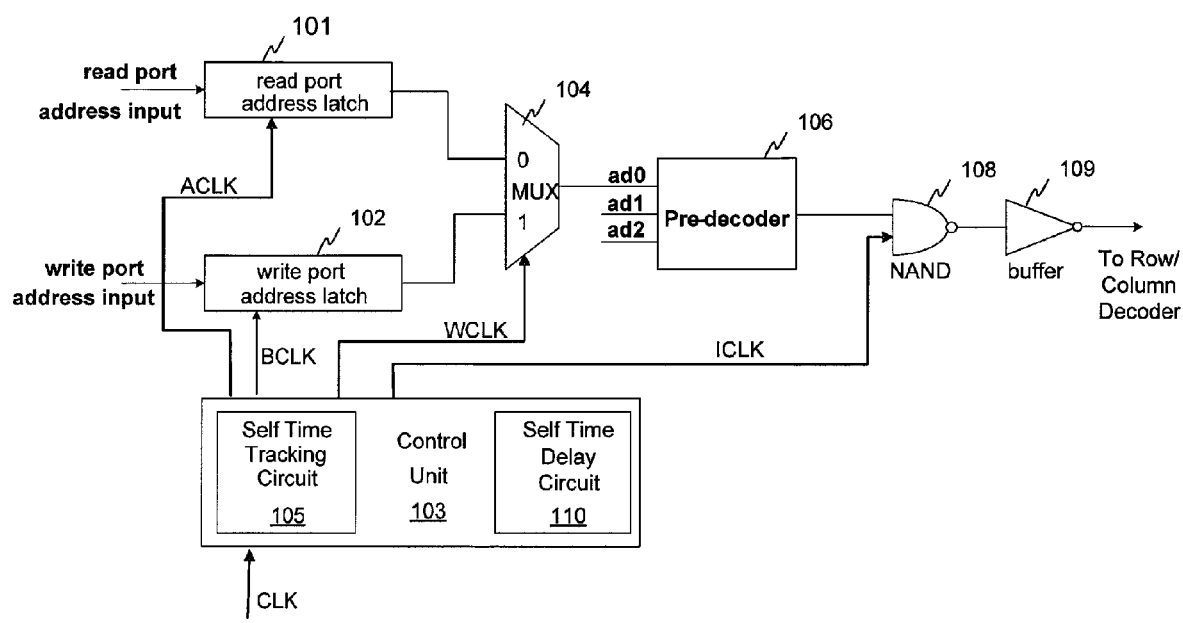
FIG. 1 is a high-level block diagram of an address multiplexing system for use with and/or as part of a pseudo-dual port memory.

FIG. 1 is a high level block diagram of an address multiplexing system 10 in accordance with one embodiment for use with and/or as part of a pseudo-dual port memory. Although two ports are provided externally, pseudo-dual port memory has only one single port internally. Thus, an address switch is required when both read and write operations are executed during one input clock cycle, i.e., a clock cycle external to the memory herein called an external system clock cycle. Embodiments of the present invention are directed to providing address multiplexing for and/or in a pseudo-dual port design with minimum performance and area penalty.

According to embodiments of the invention, a read operation is set as a default operation and, when requested, is executed first resulting in a fast read access time. When both read and write operations are to be performed during a single clock cycle, a write operation is performed immediately after completion (or substantial completion) of the read operation using an internally stored and latched write address. Although completion of a read operation is often defined by valid external read output, the present disclosure does not require such a condition. For example, maturation of a dummy bit line is one possible event that could indicate "completion" of a read operation.

In the address multiplexing system 10, the read address is stored in latch 101 while the write address is stored in latch 102. In one embodiment, the memory is static random access memory (SRAM).

A multiplexer 104 operates to selectively provide a read address and/or a write address to a pre-decoder 106. Operation of the multiplexer 104 is responsive to any preceding read operation. Within a control unit 103, for example, a self time tracking circuit 105 may be used to detect read completion to cause the multiplexer 104 to switch and supply a write address to the pre-decoder 106. If both read and write operations are required, then the write operation is performed substantially immediately after completion of the read operation. Monitoring the read operation to determine when the read operation is complete (or substantially complete) occurs using well known methods, such as tracking a dummy bit line.

An external system clock CLK active edge (rising/falling) may be used to trigger initiation of an internal clock signal ICLK through the control unit 103. Also in response to the external system clock CLK active edge, the control unit 103 generates both a read latch signal ACLK and write latch signal BCLK to substantially simultaneously latch respective read and write addresses (in those cases when both read and write operations are to be performed during the same external clock cycle). A write address switch signal WCLK is maintained in a first (e.g., low) state causing the multiplexer 104 to provide the read address to an address bus (e.g., predecoder 106, row/column decoder, word lines, etc.) during which time the memory starts and completes an internal read cycle.

When the read operation is completed or substantially completed, the internal clock signal ICLK is automatically reset by a self time tracking circuit 105 so as to release a read port address latch 101 enabling it to receive a new read address while a previously received write address is kept latched by a write port address latch 102. Also, after the read operation has been determined to be complete (or substantially complete) the address switch signal WCLK switches state (e.g., goes high) and the write address stored in write port address latch 102 is switched by the multiplexer 104 into the pre-decoder 106 to wait for the start of the next write operation.

The internal clock signal ICLK is again asserted by the control unit 103, this time to start the write operation. The interval between these two internal clock signal ICLK pulses is generated by a self-time delay circuit 110 to ensure not only that the write operation will not affect the previous read operation, but also that the write address supplied through the pre-decoder 106 will arrive at the output of the pre-decoder 106 and will be provided to the input of a latch (e.g., NAND 108) prior to occurrence of the rising edge of a second internal clock signal ICLK cycle. Having the write address available at the input of the latch 108 prior to the second internal clock cycle is desirable to avoid the possibility of an error being generated at the output of the address latch (e.g., NAND 108) should the input signal to the gate 108 change or not have stabilized.

In one embodiment, the self time delay circuit 110 is set by post layout simulation. After the read operation is determined to be complete (or substantially complete) enough delay is provided to prevent read and write address conflicts. The delay also should be sufficient to enable bit lines to be equalized prior to a write operation. The delay is a static delay, programmable by a metal mask.

After the write operation is completed, (or substantially completed) internal clock signal ICLK is again reset and the write port address latch 102 is released to receive any new write address. Write address switch signal WCLK is also reset (e.g., set to a low logic level such as "0") such that a memory access condition or state is restored to a default read mode awaiting a next external system clock cycle. The write operation is determined to be complete by the self time tracking circuit 105 in a known manner, e.g., dummy bit line tracking.

Operation of the multiplexer 104 further accommodates read only and write only memory operation/access during a particular external clock cycle. In the case of a read only operation, only the read latch signal ACLK and not the write latch signal BCLK is operative, the latter maintaining some idle condition (e.g., a low or zero state). In the case of a write only operation (e.g., when no read operation is performed during a particular external clock cycle), the write address switch signal is set to a high level during initial circuit operation so that the write address is provided to the pre-decoder 106 at the earliest opportunity.

In operation and with reference to FIG. 1, a read port address input is applied to a read port address latch 101. Likewise, a write port address input is applied to a write port address latch 102. A control unit 103 provides respective control signals (i.e., read latch signal ACLK and write latch signal BCLK) to the read and write port address latches 101 and 102, respectively, to cause the latches 101, 102 to receive and hold the respective port address inputs. The control unit 103 further generates and provides an internal clock signal ICLK to a gate, such a s the NAND device 108. Address switching is performed by a multiplexer 104 which receives both the latched read and write port addresses from the read and write port address latches 101 and 102 and, responsive to the write address switch signal WCLK from the control unit 103, selectively provides one or the other to the pre-decoder 106. The self time tracking circuit 105 can be provided within the control unit 103 and can take part in the decision on when to switch the write address switch signal WCLK. Although the pre-decoder 106 is depicted as a typical memory addressing component receiving an address signal, other and/or alternative components may be employed such as an address buffer, address decoder, etc.

In the present embodiment, the binary coded address signal supplied to the pre-decoder 106 results in activation of a particular output line, the signal being supplied to the associated NAND gate 108. The NAND gate 108 receives the internal clock signal ICLK for gating the output from the pre-decoder 106 to thereby supply an inverted output to a buffer 109. An output of the buffer 109 is then transmitted to a row/column decoder (not shown) and/or other memory components.

Figure 2:
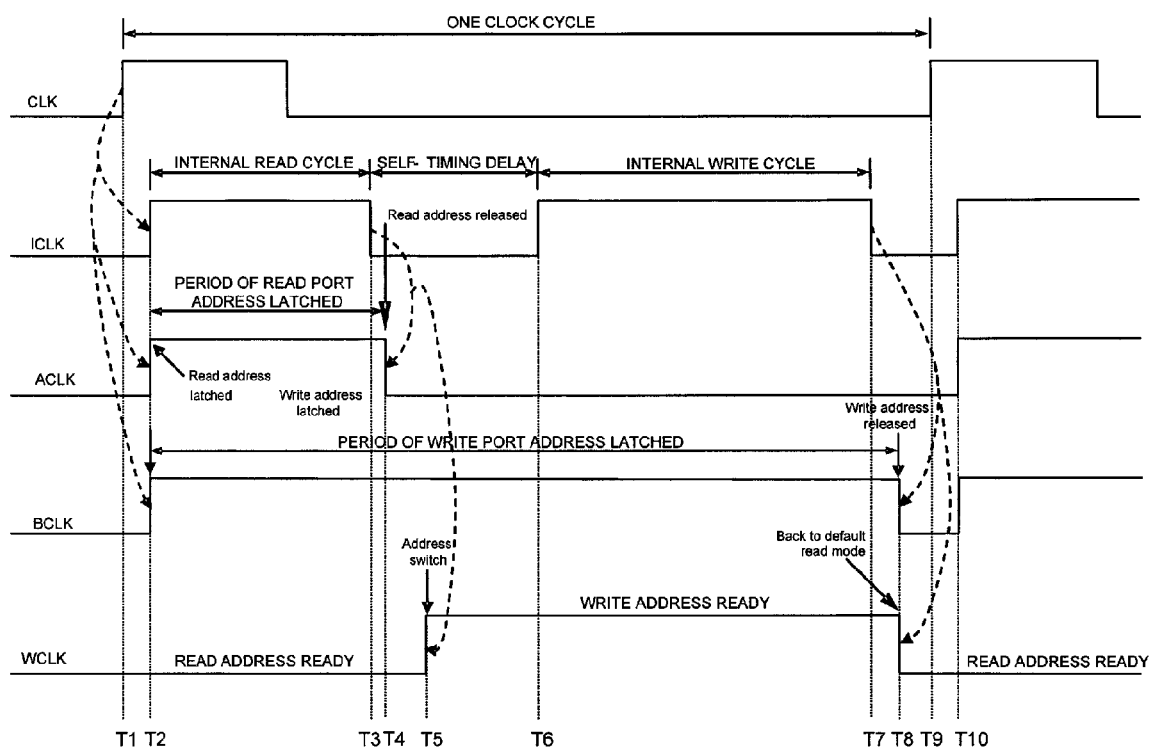
FIG. 2 is a timing diagram that illustrates a first scenario (Case #1) of an operation of the address multiplexing system of FIG. 1.
Figure 3:
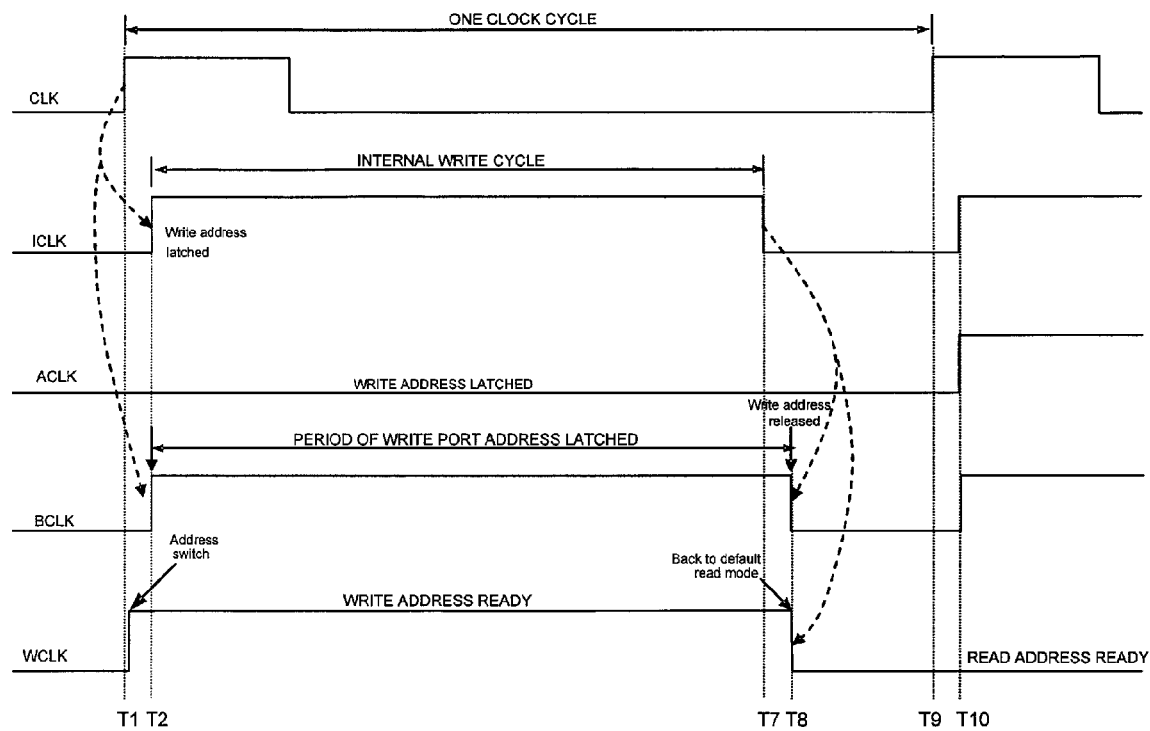
FIG. 3 is a timing diagram that illustrates a third scenario (Case #3) of an operation of the address multiplexing system of FIG. 1.

FIG. 2 is a timing diagram of a first scenario (Case #1) in which both read and write operations are requested and are to be performed during a single external system clock cycle. FIG. 3 depicts a write only operation to be performed during an external system clock cycle.

Referring to FIG. 2, the start of a next external system clock cycle is signaled by the rising edge of an external system clock signal CLK at time T1. In response to the external system clock signal CLK going high, an internal clock signal ICLK is generated by the control unit 103 and goes high at time T2, a propagation delay after T1. Also, in response to the external system clock signal CLK going high, a read latch signal ACLK and write latch signal BCLK go high at time T2, thereby latching and holding input read and write addresses.

The read operation is monitored by the self time tracking circuit 105 to determine when it is complete (or substantially complete). After the read operation is complete (or substantially complete), at time T4, the internal clock signal ICLK goes low to initiate transition to a write mode. Note that this transition is independent of the external system clock signal CLK. The time when the internal clock signal ICLK goes low is determined by the self time tracking circuit 105 that monitors the read operation. In one embodiment, the entire memory bit line and word line propagation time is monitored. For example, a dummy bit line can be employed to track the read operation, as is well known in the art.

In response to the internal clock signal ICLK going low at time T3, the read latch signal ACLK goes low at T4 so that the read port address latch 101 is released and can respond to application of a new read port address input. At time T5 and in response to the read latch signal ACLK going low, the write address switch signal WCLK goes high. A high WCLK signal indicates that a write address is ready and causes the multiplexer 104 to switch and thereby selectively transmit the write address stored in the write port address latch 102 to the pre-decoder 106 (instead of the previously transmitted read address).

A self timing delay begins at time T3. The self timing delay is provided by the self time delay circuit 110. Although the description discusses starting the self time delay in response to the internal clock signal ICLK going low at time T3, in an alternate embodiment, the self time delay begins when the read latch signal ACLK goes low at time T4.

After the self timing delay, the internal clock signal ICLK goes high at time T6, to thereby initiate the next memory access in the form of an internal write cycle. When the internal write cycle ends, the internal clock signal ICLK returns to a low level at time T7. As noted above the self time tracking circuit 105 monitors the write operation using well known technology, such as monitoring of dummy bit lines, to determine when the write operation has been completed.

Having completed the write operation and in response to the internal clock signal ICLK going low, at time T8 the write latch signal BCLK goes low thereby releasing the write port address latch 102 and enabling it to receive any new write address to be used during a next external system clock cycle. Also in response to the internal clock signal ICLK going low, the write address switch signal WCLK goes low to reset the multiplexer 104 to an initial condition whereby the output of the read port address latch 101 is transmitted to the pre-decoder 106 so as to be ready for any next read request. At time T9 the external system clock signal CLK goes high indicating the start of the next system memory access cycle such that internal clock signal ICLK, read latch signal ACLK and write latch signal BCLK go high at time T10 repeating the procedure previously detailed (at least to the extent that both read and write access operations are requested and are to be performed during that next external system clock period).

In another embodiment, only a read operation is to be performed, i.e., no write operation is requested or is to be performed during a particular external system clock cycle. It is known that a read operation has been requested, while no write operation has been requested, by monitoring chip select pins. One chip select pin is provided for a read operation, while a second chip select pin is provided for a write operation.

Without any write address being supplied (i.e., the appropriate chip select pin is not selected), the write latch signal BCLK can be kept low so as to be ready to receive any applied signal that might arrive (although embodiments of the invention may also include those that do not inhibit transition of the signal BCLK as shown in FIG. 2). Likewise, absent a write request, the write address switch signal WCLK is also maintained low, i.e., in a read state, so as to cause the multiplexer 104 to continuously transmit the read port address input signal latched and held by the read port address latch 101 to the pre-decoder 106. Otherwise, signals required to implement a read operation are performed between times T1 and T4 as explained above with reference to FIG. 2. The signals necessary to implement memory write support operations including time T5-T8, as shown in FIG. 2, may be omitted as unnecessary.

FIG. 3 is a timing diagram of a third scenario in which only a write operation is to be performed, i.e., no read operation is requested or is to be performed during a particular external system clock cycle (the read operation chip select pin is not selected). Without any read address being supplied, the read latch signal ACLK can be kept low so as to be ready to receive any applied signal that might arrive. Note that embodiments of the invention may also include those that do not inhibit transition of the read latch signal ACLK as previously shown in FIG. 2. Absent a read request, the write address switch signal WCLK may be set to a high level in response to the write latch signal BCLK rising (at time T5) so as to cause the multiplexer 104 to transmit the write port address input signal latched and held by the write port address latch 102 to the pre-decoder 106.

In general, omitting signals only necessary for a read, those signals necessary to perform the write operation may be advanced, i.e., initiated earlier during a cycle of the external system clock signal CLK than when both read and write operations are requested and are to be performed. Likewise, as in the second scenario of a read-only operation, the internal clock signal ICLK need only include a single cycle during which, in this third scenario, a write operation is performed. Thus, at time T2 the internal clock signal ICLK goes high as does the write latch signal BCLK. Because write operations generally require more time to complete than do read operations, the pulse width of the internal clock signal ICLK is extended to remain high until time T7. In response to the falling edge of the internal clock signal ICLK, both the write latch signal BCLK and the write address switch signal WCLK return to a low level to ready the circuit to accept a new write address.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although certain specific embodiments are described above for instructional purposes, the present invention is not limited thereto. The control circuitry of the pseudo-dual port memory can be used in embodiments where the first memory access operation is a write operation and the second memory access operation is a read operation, where the first memory access operation is a write operation and the second memory access operation is a write operation, and where the first memory access operation is a read operation and the second memory access operation is a read operation. Accordingly, various modifications, adaptations, and combinations of the various features of the described specific embodiments can be practiced without departing from the scope of the invention as set forth in the claims.

What is claimed is:

1. A pseudo dual port memory address multiplexing system comprising:
   a read port address latch operable to hold a read address in response to an external clock signal;
   a write port address latch operable to hold a write address in response to the external clock signal;
   a control circuit that controls read/write memory access based upon monitoring of a first memory operation by sending a switch signal; and
   a multiplexer that switches between a held read address and a held write address in response to the switch signal from the control circuit.

2. The pseudo-dual port memory address multiplexing system of claim 1, in which the first memory operation is a memory read operation.

3. The pseudo-dual port memory address multiplexing system of claim 2, in which the read port address latch releases after the read operation.

4. The pseudo-dual port memory address multiplexing system of claim 3, in which the write address latch remains latched after the read operation.

5. The pseudo-dual port memory address multiplexing system of claim 4, in which the write port address releases after a write operation.

6. The pseudo-dual port memory address multiplexing system according to claim 2, in which the control circuit comprises a self time tracking circuit that initiates generation of the switch signal is response to detected completion of said read operation.

7. The pseudo-dual port memory address multiplexing system according to claim 6, wherein the detected completion is based upon monitoring of a dummy bit line.

8. The pseudo-dual port memory address multiplexing system according to claim 2, in which the control circuit advances a timing of a write operation in response to an absence of a read request.

9. The pseudo-dual port memory address multiplexing system according to claim 2, wherein said multiplexer is operable to maintain a default condition whereby said read address is transmitted to said memory address unit.

10. The pseudo-dual port memory address multiplexing system according to claim 2, further comprising a pre-decoder that receives the held write address after the read operation is at least substantially complete.

11. The pseudo-dual port memory address multiplexing system according to claim 10, further comprising a gate that receives the write address from the pre-decoder before receiving a second assertion of an internal clock signal, a first assertion of the internal clock signal being responsive to the external clock signal.

12. The pseudo-dual port memory address multiplexing system according to claim 1, in which the control circuit comprises a self time delay circuit that creates a self timing delay, the control circuit asserting an internal clock signal after the self timing delay to start a second memory operation.

13. The pseudo-dual port memory address multiplexing system according to claim 1, wherein said control circuit is operative to identify read/write, read only, and write only modes of operation.

14. The pseudo-dual port memory address multiplexing system according to claim 1, in which the first memory operation is a write operation.

15. A method of controlling an application of an address signal to a memory comprising:
   detecting read and write requests;
   in response to a read request in the absence of a write request, supplying a read address to a memory component;
   in response to a write request in the absence of a read request, supplying a write address to said memory component; and
   in response to both a read request and a write request to be performed during a single clock cycle,
      i) supplying said read address to said memory component,
      ii) based upon monitoring of a read operation, determining a time within said single clock cycle to supply said write address to said memory component, and
      iii) switching between said read address and said write address to thereby supply said write address to said memory component at the determined time.

16. The method according to claim 15, wherein said determining includes sensing a condition of a dummy bit line.

17. The method according to claim 15, wherein said determining includes detecting a completion of a read operation.

18. The method according to claim 15, wherein, in response to both said read request and said write request to be performed during said single clock cycle, said write and read addresses are stored in respective read and write port address latches during a first period and, during an immediately subsequent period, only said write address is stored in said write port address latch and said read port address latch is released.

19. The method according to claim 15, further comprising generating an internal clock signal having a frequency dependent on whether both said read and write requests are present during an initial time period or only one of said read and write request are present during said initial time period.

20. The method according to claim 15, further comprising generating an internal clock signal having a period dependent on whether only a write request is present during said initial time period.

* * * * *